(12) United States Patent
Park et al.

(10) Patent No.: US 9,356,225 B2
(45) Date of Patent: May 31, 2016

(54) ACTUATOR USING ELECTRO-ACTIVE POLYMER AND ELECTRONIC DEVICE THEREWITH

(71) Applicant: Samsung Electronics Co., Ltd., Gyeonggi-do (KR)

(72) Inventors: Jin-Hyoung Park, Gangwon-do (KR); Yu-Dong Bae, Gyeonggi-do (KR); Eun-Hwa Lee, Gyeonggi-do (KR); Dae-Kwang Jung, Gyeonggi-do (KR); Ji-Hoon Jung, Seoul (KR)

(73) Assignee: Samsung Electronics Co., Ltd (KR)

( * ) Notice: Subject to any disclaimer, the term of this patent is extended or adjusted under 35 U.S.C. 154(b) by 332 days.

(21) Appl. No.: 13/914,140

(22) Filed: Jun. 10, 2013

(65) Prior Publication Data
US 2013/0328447 A1    Dec. 12, 2013

(30) Foreign Application Priority Data

Jun. 8, 2012    (KR) .................. 10-2012-0061684

(51) Int. Cl.
*H01L 41/09*    (2006.01)
*G06F 3/01*    (2006.01)
*G06F 3/0354*    (2013.01)

(52) U.S. Cl.
CPC ............ *H01L 41/0973* (2013.01); *G06F 3/016* (2013.01); *G06F 3/03547* (2013.01); *H01L 41/094* (2013.01); *H01L 41/0933* (2013.01)

(58) Field of Classification Search
CPC ........................................... G11B 5/716
USPC .................. 310/328, 329, 800; 428/98, 212
See application file for complete search history.

(56) References Cited

U.S. PATENT DOCUMENTS

| | | | |
|---|---|---|---|
| 2014/0145560 A1* | 5/2014 | Park ................ | H01L 41/0933 310/323.01 |
| 2014/0333179 A1* | 11/2014 | Oh .................. | B06B 1/0633 310/323.01 |

FOREIGN PATENT DOCUMENTS

| | | |
|---|---|---|
| KR | 101046017 | 7/2011 |
| KR | 1020110075714 | 7/2011 |

* cited by examiner

*Primary Examiner* — Thomas Dougherty
(74) *Attorney, Agent, or Firm* — The Farrell Law Firm, P.C.

(57) ABSTRACT

An actuator using an electro-active polymer is provided. The actuator includes a vibration plate fixed to an electronic device; at least one electro-active polymer attached to the vibration plate, and activated when electric voltage is applied thereto; and at least one mass joined to at least one a combination member disposed on the vibration plate.

2 Claims, 10 Drawing Sheets

ACTUATOR USING ELECTRO-ACTIVE POLYMER AND ELECTRONIC DEVICE THEREWITH

PRIORITY

This application claims priority under 35 U.S.C. §119(a) to Korean Application Serial No. 10-2012-0061684, which was filed in the Korean Intellectual Property Office on Jun. 8, 2012, the entire content of which is incorporated herein by reference.

BACKGROUND OF THE INVENTION

1. Field of the Invention

The present invention generally relates to the provision of haptic feedback in an electronic device, and more particularly, to an actuator for providing haptic feedback using an electro-active polymer, and electronic device therewith.

2. Description of the Related Art

A haptic feedback refers to a means of expressing information depending on a tactile sense and a skin contact of a user, which includes a force feedback function for remote controlling a robot arm. Recently, an effort has been made to use a haptic feedback as a means of notifying a user that a signal value of a key, which is selected by the user, is normally input when the user operates a touch panel as well as a simple vibration function of notifying the user of receiving a call in a portable terminal such as a cellular phone.

With the emergence of electronic devices having a touch panel for providing a full-browsing screen, an input unit such as a keypad, for inputting data is established in a button form or an icon form. When a user touches the input unit displayed on the touch panel screen, the input unit inputs a signal value allocated to a point by sensing the point that the user touches. However, an input method of touching the input unit displayed on the full-browsing screen has a problem in that the input unit cannot transfer a tactile recognition (i.e. a feeling of a click) to a user, differently from a conventional button type keypad. That is, in a case of a mechanical button input unit, such as a general dome switch and the like, when a user pushes the button type input unit, a feeling of a click is provided to the user. Accordingly, the user can tactually recognize an operation of a keypad. Therefore, although the user does not identify the input status through the screen of the touch panel, it is possible to recognize that numbers or letters which the user intends to input are input. However, it is difficult for the user to tactually identify an input of the numbers or letters by touch of the touch panel. Accordingly, an effort has been made to solve an inconvenience in that the user must identify a value input through the screen of the touch panel each time, by providing a haptic feedback function to the electronic device which has a touch panel type input unit mounted thereon. The haptic feedback function of the electronic device can be achieved by operating an actuator when the touch panel is operated.

A haptic feedback device is disclosed in Korean Patent Laid-open Publication No. 10-2011-0075714, and Korean Patent No. 10-1046017, both of which are incorporated herein by reference.

The publication and the patent disclose a DC motor actuator, a linear motor actuator, a piezo-actuator, a shape memory alloy actuator, an electro-active polymer actuator, and the like, as an actuator for providing a haptic feedback according to a touch of a touch panel. The electro-active polymer actuator has advantages in that it has a reaction speed more rapid than that of other actuators, can provide a large haptic feedback compared with an input electric power, is thin and light, and is cheap. The electro-active polymer actuator has flexibility, so there is an advantage in that it can be applied to a touch panel with a flexible display. However, although the electro-active polymer actuator has the above-mentioned advantages, there is a problem in that the electro-active polymer actuator has a structure and a circuit which are not completely developed and which is insufficient for a vibration actuator.

SUMMARY OF THE INVENTION

The present invention has been made to address at least the problems and disadvantages described above, and to provide at least the advantages described below. Accordingly, aspects of the present invention provide an electro-active polymer actuator using an electro-active polymer in order to provide a haptic feedback according to a touch to a panel provided in an electronic device, and a flexible touch panel having the same.

Another aspect of the present invention is to provide an electro-active polymer actuator in which a flexible electro-active polymer is provided in the actuator to generate vibrations and makes the actuator easily flexible so that the actuator can be used in a curved structure and can be stable irrespective of the vibration of the actuator, and a flexible touch panel having the same.

In accordance with an aspect of the present invention, an actuator using an electro-active polymer is provided. The actuator includes a vibration plate having both ends fixed to an electronic device; an electro-active polymer attached to a lower surface of the vibration plate, and activated when electric voltage is applied thereto; and a mass combined with a combination member placed on the vibration plate between both ends of the vibration plate, and having both ends suspended around the combination member over the vibration plate.

In accordance with another aspect of the present invention, an actuator using an electro-active polymer is provided. The actuator includes a vibration plate having one end thereof fixed to an electronic device; an electro-active polymer attached to a lower surface of the vibration plate, and activated when electric voltage is applied thereto; and a mass having combined with a combination member which is disposed on another end of the vibration plate, and one end thereof suspended around the combination member over one end of the vibration plate.

In accordance with still another aspect of the present invention, an actuator using an electro-active polymer is provided. The actuator includes a vibration plate fixed to an electronic device so that both ends thereof are suspended; an electro-active polymer attached to a lower surface of the vibration plate, and activated when electric voltage is applied thereto; and a mass being suspended over the vibration plate, and including a first mass provided to one end of the vibration plate and a second mass provided to other end of the vibration plate opposite the first mass.

In accordance with yet another aspect of the present invention, an electronic device having actuators using electro-active polymers is provided. The electronic device includes a flexible touch panel; and the plurality of actuators arranged beneath a lower surface of the touch panel and respectively having one or more electro-active polymers, wherein the actuators using the electro-active polymer include: a vibration plate fixed to the electronic device by means of at least one fixing member; one or more electro-active polymers attached to the vibration plate and activated when electric voltage is applied thereto; and at least one mass combined with an upper surface of the vibration plate so that at least one end of the mass is suspended around a combination member, and increasing a vibration force of the vibration plate as the electro-active polymer is activated.

BRIEF DESCRIPTION OF THE DRAWINGS

The above and other aspects, features, and advantages of the present invention will be more apparent from the following detailed description taken in conjunction with the accompanying drawings, in which.

DETAILED DESCRIPTION OF EMBODIMENTS OF THE PRESENT INVENTION

Figure 1A:
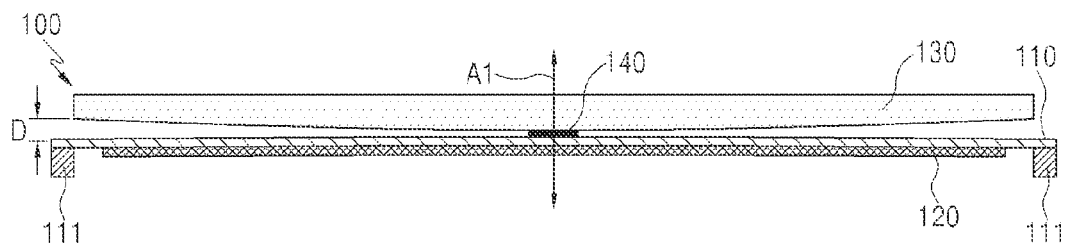
FIGS. 1A to 1C are cross-sectional views illustrating an actuator using an electro-active polymer according to an embodiment of the present invention, which show a vibration state of the actuator.

Hereinafter, an actuator using an electro-active polymer and a flexible touch panel having the same of the present invention will be described with reference to the accompanying drawings. In the description, thicknesses of lines and a size of a structural element shown in the drawings may be exaggeratedly depicted for clarity and convenience of the description. Further, the terms mentioned below are defined considering functions of the present invention, and may be changed according to a user, an operator's intention, or custom. Therefore, the terms should be defined based on a subject matter throughout the description of the present invention.

The terms including ordinal numbers such as first, second, etc. may be used to describe various structural elements. However, the terms are only used to distinguish a structural element from another structural element, and the order of the structural elements can be temporarily determined. The preceding description may be applied to a succeeding element.

The present invention provides an actuator using an electro-active polymer, which provides a haptic feedback and stably operates on a flat vibration plate and a curved vibration plate, and which is capable of stably and reliably operating even though a vibration is generated. In addition, the present invention provides the curved plate with the electro-active polymer so as to provide various types of haptic feedback.

Further, the present invention provides a flexible touch panel with a plurality of actuators using an electro-active polymer so that the flexible touch panel can be variously deformed by means of electric voltage which is applied to the flexible touch panel.

Hereinafter, actuators using an electro-active polymer according to the embodiments of the present invention will be described with reference to FIGS. 1A to 12. FIGS. 1A to 4 show an embodiment of the present invention, FIGS. 5A to 8 show another embodiment of the present invention, FIGS. 9A to 12 show another embodiment of the present invention, and FIGS. 13 to 16 schematically show flexible touch panels which respectively have a plurality of actuators using an electro-active polymer.

Figure 1B:
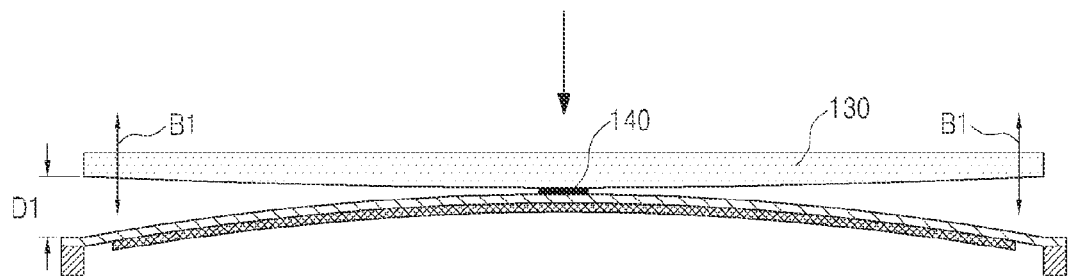
Figure 1C:
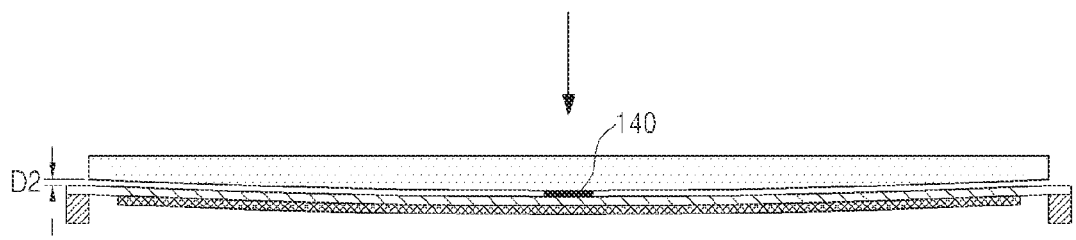

Firstly, an embodiment of the present invention will be described with reference to FIGS. 1A to 4. Further, FIGS. 1A to 4 show an embodiment in which some variations having a similar structure and a little difference are shown, and are depicted for the description of the embodiment. FIGS. 1A to 1C show an actuator using an electro-active polymer according to an embodiment of the present invention, which shows a vibration state of the actuator. Referring to FIGS. 1A to 1C, the actuator 100 using the electro-active polymer includes a vibration plate 110, the electro-active polymer 120, and a mass 130. The vibration plate 110 is made of a stainless steel or polyethylene terephthalate material. The vibration plate 110 is provided to an electronic device (not shown) in which a haptic feedback can be provided, both ends of which are fixed to both sides of the electronic device for providing the haptic feedback. The vibration plate 110 has two ends, which are attached to the electronic device by means of two fixing members 111. In an embodiment of the present invention, the vibration plate 110 has two fixing members 111 at both ends thereof. However, in another embodiment, as described later, the actuator may have a structure different from that of the embodiment illustrated in FIGS. 1A-4. That is, the vibration plate 110 has a fixing member 211 at one end or the other end thereof. Other embodiments may also have different structures. The flat vibration plate 110 having both ends fixed to the electronic device by means of the fixing members 111 is deformed upward and downward around the fixing members 111 of both ends thereof (e.g., like a bow). A bending limit and shape of the vibration plate 110 can be changed according to a voltage applied to the electro-active polymer 120. An example of the flat vibration plate 110 of which a center portion vibrates convexly and concavely around the fixing members 111 will now be described.

The electro-active polymer 120 is attached on a lower side of the vibration plate 110 and conforms to the lower surface of the vibration plate 110. The electro-active polymer 120 is activated to contract or expand when the electric voltage is applied thereto, and consequently drives the vibration plate 110 to be deformed concavely and convexly like a bow. Various types of haptic feedback can be provided according to a method of applying the voltage to the electro-active polymer 120. For example, by alternately providing electric current having different polarities, the electro-active polymer 120 is activated to vibrate upward and downward in a direction of A1 of FIG. 1, and the vibration plate 110 vibrates in an upward and downward direction A1 along with the electro-active polymer 120. If the electric current having the same polarity is supplied to the electro-active polymer 120 for a predetermined time, the electro-active polymer 120 is maintained in a deformed state. Accordingly, if the electro-active polymer 120 is provided to the flexible touch panel, the flexible touch panel can be maintained in a deformed state corresponding to the deformed state of the electro-active polymer, thereby visually providing a haptic feedback.

The mass 130 is provided over the vibration plate 110, and increases a vibration force of the vibration plate when the vibration plate 110 vibrates as the electro-active polymer 120 is contracted or expanded. The mass 130 has a combination member 140 to join the mass 130 to the upper surface of the vibration plate 110. The combination member 140 is located between both ends (i.e. the fixing members 111) of the vibration plate 110 to fix both ends to the electronic device. The mass 130 has both sides suspended over the vibration plate 110 as they extend from the combination member 140 outwardly to both ends of the vibration plate 110. More particularly, the mass 130 has a lower surface formed to be curved or inclined so that both sides of the mass 130 are respectively spaced apart from the upper surface of the vibration plate 110 as the mass 130 extends from the combination member 140 to both sides thereof. The mass 130 is formed to be thickest at the center portion coming in contact with the combination member 140, and both sides of the mass 130 are spaced at a distance D from the upper surface of the vibration plate 110.

The actuator 100 using the electro-active polymer of an embodiment of the present invention, which has the above-mentioned structure, is formed so that both ends thereof are symmetric with respect to the center portion of the combination member 140. When electric voltage is applied to the electro-active polymer 120 in a state in which both ends of the vibration plate 110 are fixed to the electronic device, the vibration plate 110 has the largest displacement value (i.e. the largest movement distance) in an upward or downward direction A1, at the center portion (i.e. at the location of the combination member 140) of the vibration plate 110. As the vibration plate 110 is deformed in a form of a bow around the fixing members 111, the mass 130 is wholly moved in the upward or downward direction A1 and the combination member 140 of the mass 130 combined with the vibration plate 110 also is moved in the upward or downward direction A1. On the other hand, both sides of the mass 130, which are suspended over the vibration plate 110, vibrate in a direction B1, so as to provide a haptic feedback.

As described above, when the electro-active polymer 120 is deformed in a form of a bow along with the vibration plate 110, the combination member 140 can move upwardly or downwardly in direct proportion to a displacement value of the electro-active polymer 120 which is deformed, and can stably operate even though the vibration plate 110 is vibrated repeatedly. Accordingly, it is possible to improve a reliability of the actuator 100, and to provide a user with a high quality haptic feedback.

Figure 2:
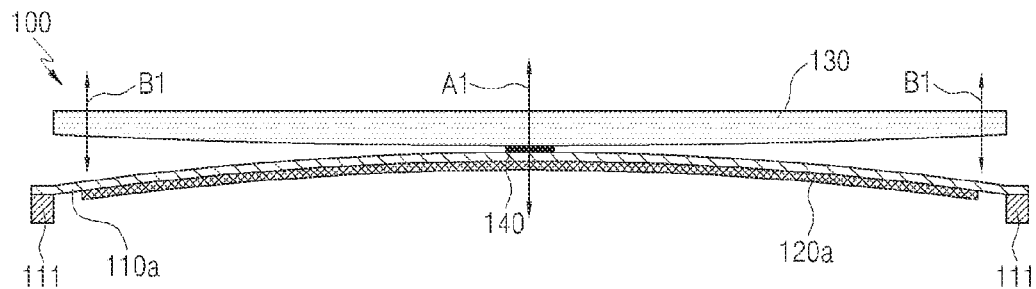
FIG. 2 is a cross-sectional view illustrating a variation example of an actuator using the electro-active polymer shown in FIG. 1, in which the actuator has a curved vibration plate.

Further, the electro-active polymer 120a according to an embodiment of the present invention is attached to a curved vibration plate 110a which has a shape of a bow so as to provide haptic feedback, as shown in FIG. 2. That is, FIG. 2 is a view illustrating an actuator using the electro-active polymer shown in FIG. 1, in which the actuator has the curved vibration plate and the electro-active polymer. Hereinafter, the actuator using the electro-active polymer will be described with reference to FIG. 2. With reference to the same structure or constitution as that of the actuator in FIG. 1, reference will be made to the above-mentioned description. The different structures or constitutions from those of the actuator in FIG. 1 will be described later. A difference between the structure of FIG. 1 and the structure of FIG. 2 is a shape of a vibration plate 110a and the electro-active polymer 120a. Both ends of the vibration plate 110a are fixed to an electronic device by means of the fixing members 111, and the curved vibration plate 110a extends between the fixing members 111 and has a bow shape with an upwardly convex orientation. The electro-active polymer 120a attached to the lower surface of the vibration plate 110a also has a bow shape with an upwardly convex orientation. Both sides of the mass 130 are suspended over the vibration plate 110a and are respectively spaced at a distance D apart from both ends of the vibration plate 110a. The distance D between each side of the mass 130 and each end of the vibration plate 110a is larger than that between each side of the mass 130 and each end of the vibration plate 110 in FIG. 1. When electric voltage is applied to the electro-active polymer 120 and the electro-active polymer 120 is contracted or expanded to be deformed, the mass 130 moves in the area of the combination member 140 in an upward or downward direction A1, and both ends of the mass 130 are moved further or closer to both ends of the vibration plate 110 repeatedly so that the mass 130 is vibrated. Accordingly, a vibration amplitude of both sides of the mass 130 increases. As a result, it is possible to provide haptic feedback in various forms according to the deformation of the vibration plate having a bow shape. Further, as the curved vibration plate 110a is vibrated, it is possible to apply the curved vibration plate 110a to an electronic device having a curved shape. In the embodiment of the present invention, the vibration plate 110a and the electro-active polymer 120a which are formed to have a bow shape with an upwardly convex orientation are described as an example, but the present invention is not limited to this example. It will be understood that the vibration plate 110a and the electro-active polymer 120a can be varied to have a bow shape with a downwardly concave orientation.

Figure 3:
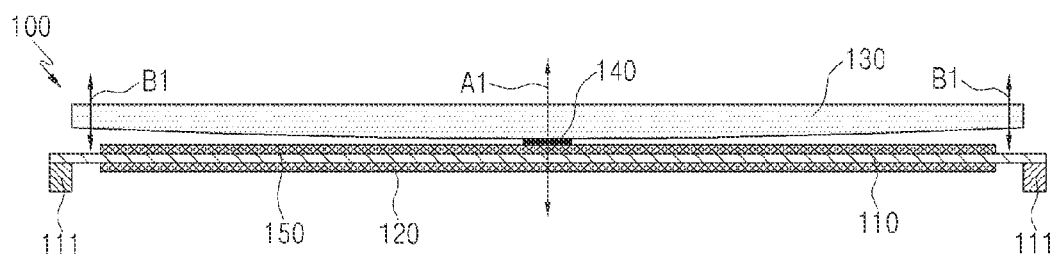
FIG. 3 is a cross-sectional view illustrating a variation example of an actuator using the electro-active polymer shown in FIG. 1, in which the actuator has two electro-active polymers attached to an upper surface and a lower surface of the vibration plate, respectively.

FIG. 3 is a view illustrating an actuator having two electro-active polymers 150 and 120 respectively attached to the upper and lower surfaces of the vibration plate 110 according to an embodiment of the present invention. The actuator 100 using the electro-active polymers 120 and 150 according to an embodiment of the present invention has the same structure as that of the actuator 100 using the electro-active polymer of FIGS. 1A to 1C, except that the actuator 100 of FIG. 3 has two electro-active polymers 120 and 150 attached to the lower and upper surfaces of the vibration plate 110. Accordingly, the description of the actuator having the same structure as that of the actuator of FIG. 1, except that in FIG. 3 two electro-active polymers are used, applies to this embodiment.

Referring to FIG. 3, two electro-active polymers 120 and 150 are provided to the flat vibration plate 110 having both ends respectively fixed to the fixing members 111 in such a manner so that the two electro-active polymers 120 and 150 are attached to the lower and upper surfaces, respectively, of the vibration plate 110. The electro-active polymer 120 (hereinafter, a first electro-active polymer 120) is provided to the lower surface of the vibration plate 110, and the second electro-active polymer 150, which differs from the first electro-active polymer 120, is provided to the upper surface of the vibration plate 110. Further, the mass 130 is joined to an upper surface of the second electro-active polymer 150 over the vibration plate 110. Therefore, the vibration plate 110 can be further deformed in various forms by electric voltage applied to the first and second electro-active polymers 120 and 150. That is, an upward and downward vibration amplitude of the vibration plate 110 having both ends fixed to the fixing members 111 can be greatly increased, and even if half of an existing electric voltage is applied to the electro-active polymers 120 and 150, the vibration plate can have the same vibration amplitude as that of the vibration plate of FIG. 1. Further, a different voltage is applied to each of the first and second electro-active polymers 120 and 150, thereby providing the vibration plate with different vibration amplitudes in an upward and downward direction A1. As a result, the vibration generated by the mass 130 can be varied so as to provide a user with various types of haptic feedback.

Figure 4:
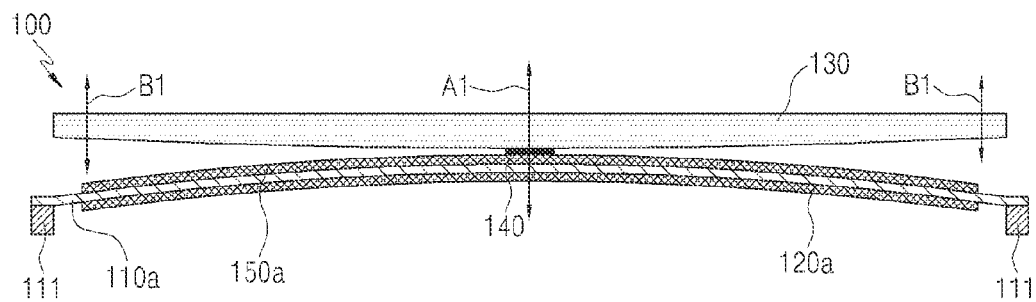
FIG. 4 is a cross-sectional view illustrating a variation example of an actuator using the electro-active polymer shown in FIG. 3, in which the actuator has a curved vibration plate and two electro-active polymers.

Further, FIG. 4 is a view illustrating an actuator having a curved vibration plate and two electro-active polymers according to an embodiment of the present invention, which is similar to the actuator having two electro-active polymers of FIG. 3. The actuator of FIG. 4 has the same structure as that of the actuator of FIG. 3. However, the actuator of FIG. 3 has a flat vibration plate 110 and two electro-active polymers 120 and 150 provided to the upper and lower surfaces of the vibration plate 110, while the actuator of FIG. 4 has a curved vibration plate 110a extending between the fixing members 111, and two electro-active polymers 120a and 150a attached to lower and upper surfaces of the curved vibration plate 110a. A spaced distance D between each side of the mass 130 and each end of the vibration plate 110a is larger than the corresponding distance in FIG. 3. Accordingly, when electric voltage is applied to the first and second electro-active polymers 120a and 150a so that the first and second electro-active polymers 120a and 150a contract and expand to deform, the combination member 140 of the mass 130 moves along the upward and downward direction A1, and both sides of the mass 130 move and vibrate repeatedly in a direction B1 so that they move further from or closer to the vibration plate 110a. As a result, the actuator can provide a haptic feedback in a form different from the actuator of FIG. 3, and may be provided to an electronic device having a curved shape. In an embodiment of the present invention, the vibration plate 110a and the first and second electro-active polymers 120a and 150a are described as an example, which are formed to have a bow shape with an upwardly convex orientation. However, the present invention is not limited to the example. It is possible for the vibration plate and the first and second electro-active polymers to have a bow shape with a downwardly concave orientation and to be changed in various forms.

In the actuator 100 using the electro-active polymer according to an embodiment of the present invention as described with reference to FIGS. 1A to 4, even though the electro-active polymers 120 are provided to the vibration plate 110a having a curved shape, it is possible to improve the reliability in an operation of the actuator 100 and to prevent damage to the actuator 100. Further, it is possible to attach a plurality of electro-active polymers 120, 120a, 150 and 150a to the vibration plate 100 or 100a, thereby providing the actuator to a flexible electronic device.

Hereinafter, an actuator using an electro-active polymer according to an embodiment of the present invention will be described with reference to FIGS. 5A to 8. FIGS. 5A to 8 show the actuator using the electro-active polymer, each of which shows an example of the actuator having a different shape and structure. The difference among the actuators will be described below.

Figure 5A:
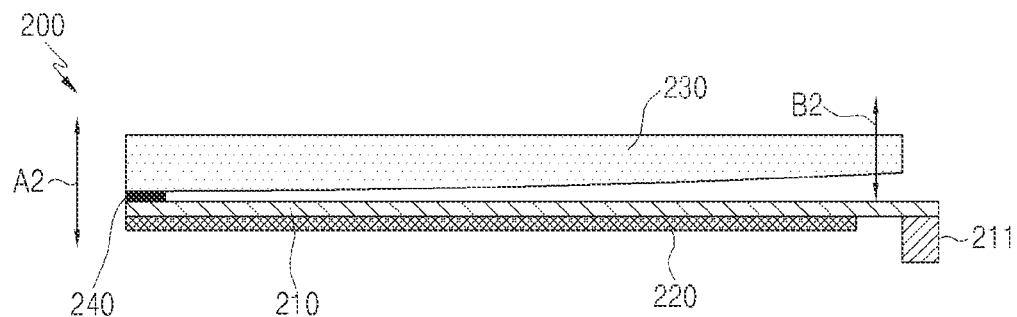
FIGS. 5A and 5B are cross-sectional views illustrating an actuator using an electro-active polymer according to an embodiment of the present invention, which show a vibration state of the actuator.
Figure 5B:
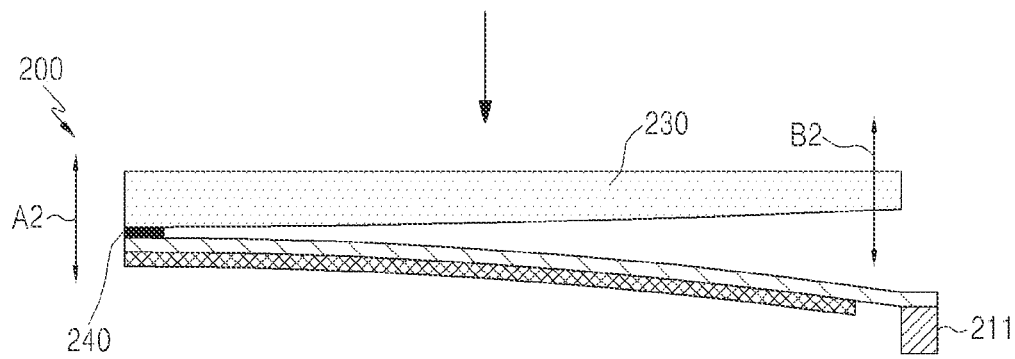

FIGS. 5A and 5B are views illustrating the actuator using the electro-active polymer according to an embodiment of the present invention, which shows a vibration state of the actuator. The actuator 200 using the electro-active polymer according to the embodiment shown in FIGS. 5A and 5B has the same structure as half the actuator (i.e. a right side or a left side of the actuator 100) using the electro-active polymer 110 shown in FIG. 1. More particularly, in the embodiment, the actuator 200 using the electro-active polymer includes a vibration plate 210, an electro-active polymer 220 and a mass 230. The vibration plate 210 has one end thereof fixed to the electronic device. That is, a fixing member 211 fixes one end (i.e., a fixed end) of the vibration plate 210 to the electronic device. The other end of the vibration plate 210 is suspended like a cantilever (i.e., free end). Further, the vibration plate 210 has the electro-active polymer 220 on a lower surface thereof, which can contract or expand to deform as electric voltage is applied thereto.

The mass 230 is coupled to the free end of the vibration plate 210 at a first end via a combination member 240 and is, therefore, suspended. Further, a second end of the mass 230 extends from the combination member 240 to the fixed end of the vibration plate 210 and floats over the fixed end of the vibration plate 210. More particularly, the mass 230 is made gradually thinner and spaced apart from the vibration plate 210 in a direction extending from the first end to the second end thereof.

In the actuator 200 using the electro-active polymer 220, which has the above-mentioned structure, when electric voltage is applied to the electro-active polymer 220 so that the electro-active polymer 220 is contracted or expanded, the free end of the vibration plate 210 is driven at the largest vibration amplitude in an upward and downward direction A2. Since the first end of the mass 230 is joined to the free end of the vibration plate 210, which is vibrated at the largest vibration amplitude in the upward and downward direction A2, the first end of the mass 230 moves as the vibration plate 210 moves in the upward and downward direction A2. Further, the second end of the mass 230 which is suspended over the fixed end of the vibration plate 210 vibrates in a direction B2 so that the second end of the mass 230 is moved further from or closer to the fixed end of the vibration plate 210, so as to apply vibration to the electronic device. As a result, a user can receive haptic feedback.

Accordingly, the actuator 200 using the electro-active polymer 220, which has a simple structure, can be made to be half the size of the actuator according to the embodiment illustrated in FIGS. 1A-4, thereby being easily mounted in a limited space on small-sized devices to provide a user with haptic feedback.

Figure 6:
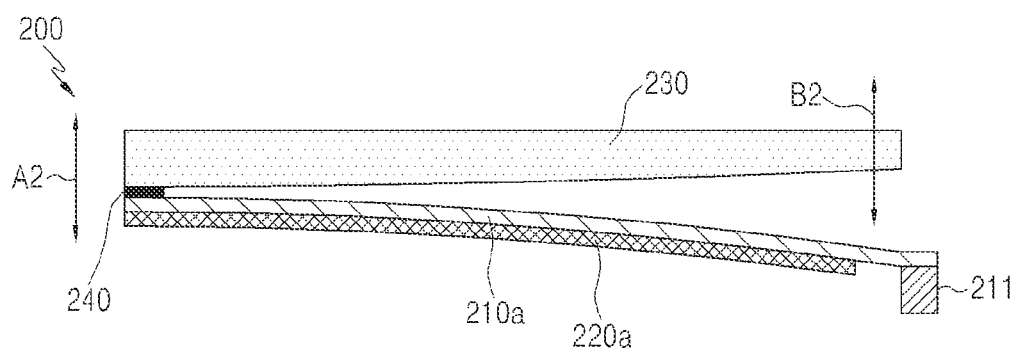
FIG. 6 is a cross-sectional view illustrating a variation example of an actuator using the electro-active polymer shown in FIG. 5, in which the actuator has a curved vibration plate and the electro-active polymer.

Further, FIG. 6 is a view illustrating a variation example of an actuator including a curved vibration plate 210a and an electro-active polymer 220a according to the embodiment of the present invention, shown in FIGS. 5A and 5B. That is, the actuator of FIG. 6 is different in that it has a curved vibration plate 210a and an electro-active polymer 220a attached to a curved lower surface of the curved vibration plate 210a, as compared to the actuator of FIG. 5. That is, referring to FIG. 6, the curved vibration plate 210a has one end fixed to an electronic device (i.e., the fixed end), and is shaped like a curved cantilever. The vibration plate 210a having the curved cantilever shape has the electro-active polymer 210a attached to the lower surface thereof, and a mass 230 joined to the free end of an upper surface thereof. The first end of the mass 230 is combined with the free end of the vibration plate 210 which has the curved cantilever shape, while the second end of the mass 230 is gradually spaced apart from and suspended over the upper surface of the fixed end of the curved vibration plate 210a.

As compared with the example of FIG. 5, it can be known that the mass 230 has a larger distance between the second end thereof and the fixed end of the vibration plate 210. Further, since the vibration plate 210a and the electro-active polymer 220a have the curved shape, the actuator can be provided to an electronic device having a curved surface or a flexible electronic device.

Figure 7:
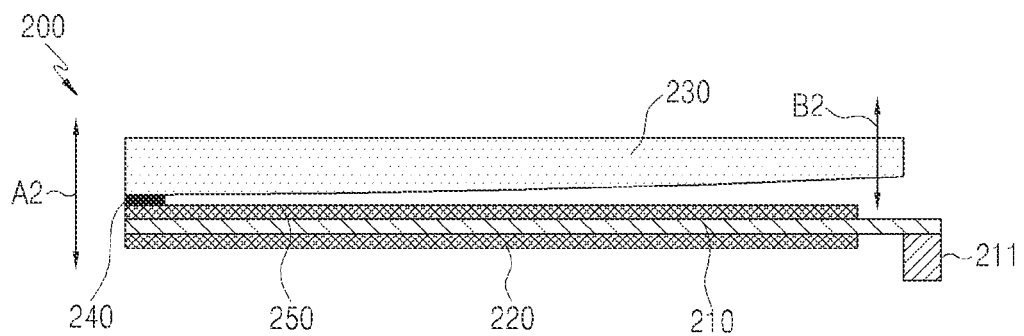
FIG. 7 is a cross-sectional view illustrating a variation example of an actuator using the electro-active polymer shown in FIG. 5, in which the actuator has two electro-active polymers respectively attached to an upper surface and a lower surface of the vibration plate.

FIG. 7 is a view illustrating a variation example of an actuator 200 having two electro-active polymers 220 and 250 respectively attached to lower and upper surfaces of a vibration plate 210 according to the embodiment of the present invention, shown in FIGS. 5A and 5B. A difference between the example of FIG. 7 and the example of FIG. 5 is a structure of the electro-active polymer. That is, in the example of FIG. 5, the flat vibration plate 210 has one electro-active polymer 220. In the example of FIG. 7, the flat vibration plate 210 has two electro-active polymers 220 and 250 provided to lower and upper surfaces thereof. Similar to the example of FIG. 5, a mass 230 is joined to the upper surface of the vibration plate 210 by means of the combination member 240, and in the example of FIG. 7, a mass 230 is provided to an upper surface of the vibration plate 210. However, since a second electro-active polymer 250 is provided to the upper surface of the vibration plate 210, the mass 230 is joined to an upper surface of the second electro-active polymer 250 by means of the combination member 240.

The flat vibration plate 210 which has one end fixed to an electronic device and a cantilever shape, includes an electro-active polymer 220 (hereinafter, a first electro-active polymer) attached to the lower surface thereof, and the second electro-active polymer 250 attached to the upper surface thereof. In the actuator 200 using the electro-active polymers 220 and 250, which has the above-mentioned structure, when electric voltage is applied to the first and second electro-active polymers 220 and 250, the vibration plate 210 vibrates around a fixing member 211 in a state that the free end of the vibration plate 210 is suspended. Further, the mass 230, which is combined with the combination member 240 provided on the free end of the vibration plate 210, moves in upward and downward directions A2 as the vibration plate 210 vibrates. Due to the movement, the second end of the mass 230 moves further from or closer to the fixed end of the vibration plate 210.

Figure 8:
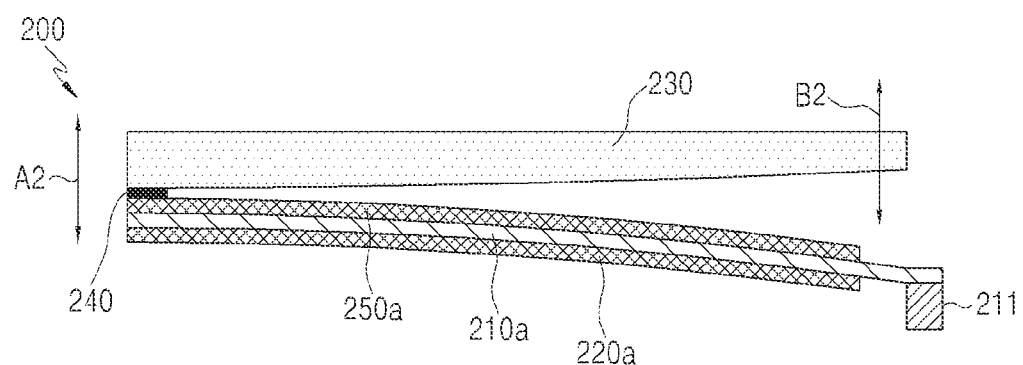
FIG. 8 is a cross-sectional view illustrating a variation example of an actuator using the electro-active polymer shown in FIG. 7, in which the actuator has a curved vibration plate and two electro-active polymers.

FIG. 8 is a view illustrating a variation example of an actuator including a curved vibration plate and two electro-active polymers according to the embodiment of the present invention, shown in FIG. 7. The actuator of FIG. 8 has the same structure as that of the actuator shown in FIG. 7. However, the actuator 200 shown in FIG. 7 includes a flat vibration plate 210 having a cantilever shape, and the first and second electro-active polymers 220 and 250 respectively attached to the lower and upper surfaces of the flat vibration plate 210, whereas the actuator 200 of FIG. 8 includes a vibration plate 210a having a cantilever shape and being formed in a curved shape around a fixing member 211, and first and second electro-active polymers 220a and 250a respectively attached to lower and upper surfaces of the curved vibration plate 210a. Therefore, the actuator 200 can be mounted in a curved space on an electronic device to provide haptic feedback. Further, the actuator can vibrate in various forms to provide a user with various types of haptic feedback due to a difference of electric voltages respectively applied to the first and second electro-active polymers 220a and 250a. Furthermore, as compared with the actuator of FIG. 7, a distance between the second end of a mass 230 and the fixed end of the curved vibration plate 210a in the actuator 200 of FIG. 8 is larger than that of FIG. 7. When electric voltages are respectively applied to the first and second curved electro-active polymers 220a and 250a, the free end of the curved vibration plate 210a vibrates and transmits a vibration force to the mass 230. Accordingly, the first end of the mass 230 is vibrated along with the free end of the vibration plate 210a which vibrates in upward and downward directions A2, while the second end of the mass 230 moves in a direction B2 further from or closer to the fixed end of the curve vibration plate 210a.

FIGS. 9A to 12 are views illustrating an actuator using an electro-active polymer according to an embodiment of the present invention. However, the actuator shown in FIGS. 9A to 12 has a similar structure and shape. In the actuator according to the embodiment of the present invention illustrated in FIGS. 9A to 12, two actuators according to the embodiment of the present invention illustrated in FIGS. 5A to 8 are integrally and symmetrically formed around one fixing member.

Figure 9A:
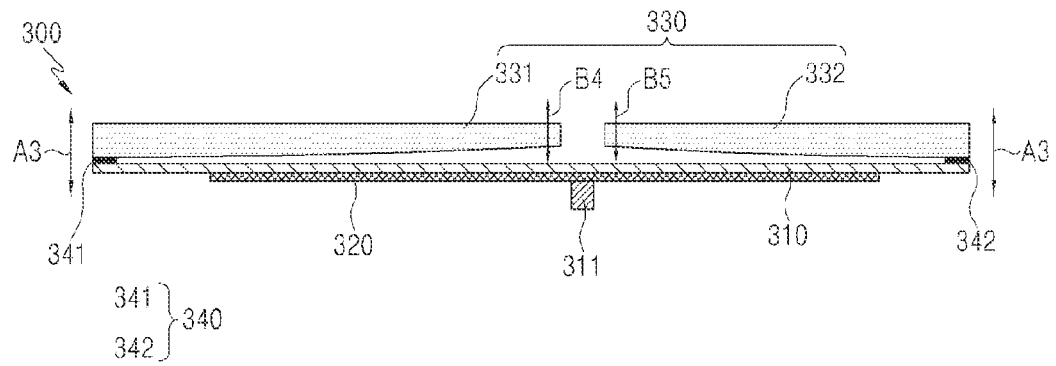
FIGS. 9A and 9B are cross-sectional views illustrating an actuator using an electro-active polymer according to an embodiment of the present invention, which show a vibration state of the actuator.
Figure 9B:
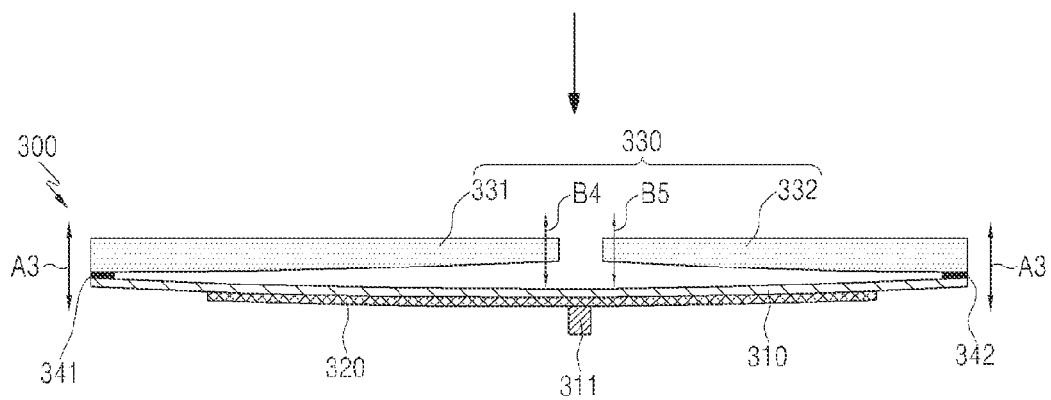

Particularly, FIGS. 9A and 9B show views illustrating the actuator using the electro-active polymer according to an embodiment of the present invention, and a vibration state of the actuator. Referring to FIG. 9A, the flat vibration plate 310 is fixed to an electronic device by means of a fixing member 311 so that both ends of the vibration plate 310 are spaced from an upper surface of the electronic device and are suspended. The fixing member 311 is formed to function as an axis between a first end and a second end of the vibration plate 310, and fixes the vibration plate 310 to the electronic device so that both ends of the vibration plate 310 are suspended around the fixing member 311. In an embodiment of the present invention, the fixing member 311 is disposed at a location which is eccentric from a center axis of the vibration plate 310 so that masses 330 respectively coupled to the first end and the second end of the vibration plate 310 via combination members 340 vibrate differently. The vibration plate 310 has an electro-active polymer 320 attached to a lower surface thereof, which is expanded or contracted as electric voltage is applied to the electro-active polymer 320.

The masses 330 are joined an upper surface of the vibration plate 310 to be suspended over the vibration plate 310, each of which is provided to each end of the vibration plate 310. That is, a first mass 332 is joined to the first end of the vibration plate 310, and a second mass 331 is joined to the second end of the vibration plate 310. The first mass 332 is fixed to the first end of the vibration plate 310 by a first combination member 342 and extends toward the second end of the vibration plate 310, preferably to the fixing member 311, so that a free end of the mass 332 is suspended over the vibration plate 310. The first mass 332 has a curved lower surface or a thickness that is gradually reduced as it extends from a fixed end thereof which is fixed to the vibration plate 310, to the free end thereof, so that a distance between the upper surface of the vibration plate 310 and the lower surface of the first mass 332 gradually increases. The second mass 331 is joined to the second end of the vibration plate 310 by means of a second combination member 341 and extends toward the first end of the vibration plate 310 to be opposite to the first mass 332. Preferably, the free end of the second mass 331 extends to the fixing member 311 to be suspended over the vibration plate 310. The second mass 331 has a curved lower surface or a thickness gradually reduced as it extends from the fixed end thereof fixed to the vibration plate 310 to the free end thereof, so that a distance between the upper surface of the vibration plate 310 and the lower surface of the second mass 332 gradually increases. Accordingly, the free end of the first mass 332 and the free end of the second mass 331 are opposite to each other and are suspended over the vibration plate 310. When the vibration plate 310 vibrates with respect to the fixing member 311, the free ends of the first and second masses 332 and 331 can be vibrated over the upper surface of the vibration plate 310 in a maximal range of vibration amplitude.

The actuator 300 using the electro-active polymer 320 according to an embodiment of the present invention is asymmetrically formed around the fixing member 311, one side of which is somewhat longer than the other side. When electric voltage is applied to the electro-active polymer 320 so that the electro-active polymer 320 contracts or expands, both sides of the vibration plate 310 which are suspended, move with respect to the fixing member 311 in upward and downward directions A3. Thereby, the first mass 332 joined the first end of the vibration plate 310 moves with respect to the first combination member 342 in upward and downward directions A3, so that the free end of the first mass 332 is suspended and is repeatedly moved in a direction B5 further from and closer to the upper surface of the vibration plate 310 to vibrate. Further, the second mass 331 which is formed to be relatively long generates a low frequency vibration while the first mass 332 generates a high frequency vibration, so as to respectively provide haptic feedback which are different from one another.

Figure 10:
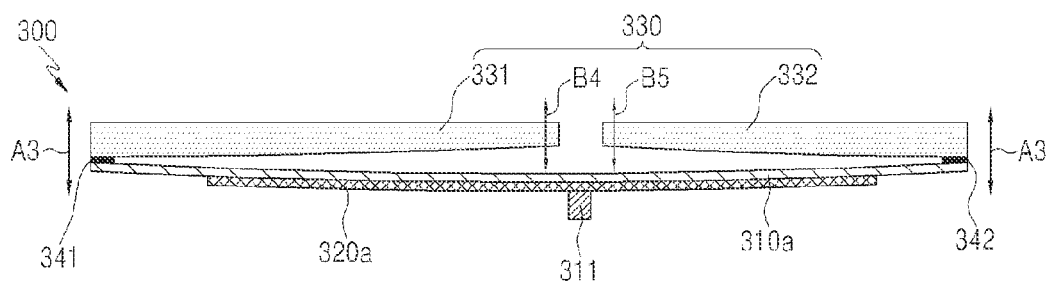
FIG. 10 is a cross-sectional view illustrating a variation example of an actuator using the electro-active polymer shown in FIG. 9, in which the actuator has a curved vibration plate and the electro-active polymer.

FIG. 10 is a view illustrating a variation example of an actuator including a curved vibration plate and an electro-active polymer according to the embodiment of the present invention, shown in FIG. 9. The actuator of FIG. 10 has a structure similar to that of the actuator shown in FIG. 9, except that a vibration plate 310a is curved concavely at a portion where the fixing member 311 is attached to the vibration plate 310a. In the present invention, it is described as an example that the vibration plate 310a is curved like a concave lens. However, it is possible that the vibration plate 310a is curved convexly like a convex lens at a portion where the fixing member 311 is attached to the vibration plate 310a. The curved vibration plate 310a has the electro-active polymer 320a attached to the curved lower surface thereof.

Accordingly, a distance between the free end of the first mass 332 and the vibration plate 310, shown in FIG. 10 is larger than that of FIG. 9. Also, a distance between the free end of the second mass 321 and the vibration plate 310a is greater than the distance between the free end of the second mass 331 and the vibration plate 310 shown in FIG. 9. The curved actuator using the electro-active polymer 320a can be provided to a curved electronic device to provide haptic feedback.

Figure 11:
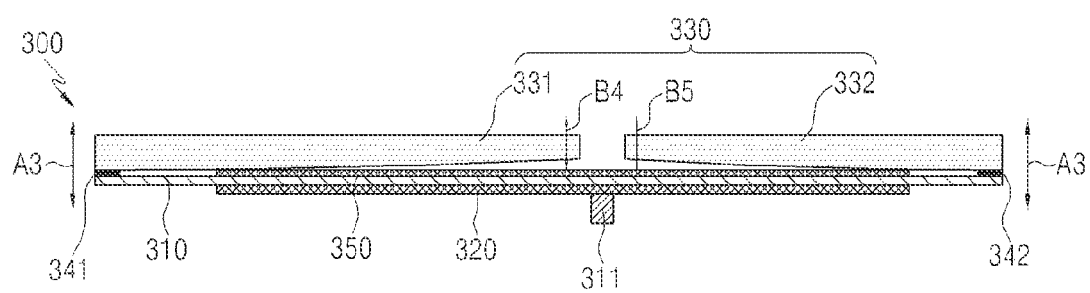
FIG. 11 is a cross-sectional view illustrating a variation example of an actuator using the electro-active polymer shown in FIG. 9, in which the actuator has two electro-active polymers respectively attached to an upper surface and a lower surface of a vibration plate.

FIG. 11 is a view illustrating a variation example of an actuator including two electro-active polymers respectively attached to upper and lower surfaces of the vibration plate according to the embodiment of the present invention, shown in FIG. 9. The difference between the actuators shown in FIGS. 9 and 11, is that the actuator of FIG. 9 has a structure that an electro-active polymer 320 is provided to the flat vibration plate 310, while the actuator of FIG. 11 has a structure that two electro-active polymers 320 and 350 are respectively provided to lower and upper surfaces of the vibration plate 310.

In the embodiment of the present invention, an electro-active polymer 320 (hereinafter, a first electro-active polymer) is attached to the lower surface of the vibration plate 310 of which both ends are suspended by a support of a fixing member 311, and a second electro-active polymer 350 is attached to the upper surface of the vibration plate 310. The first and second electro-active polymers 320 and 350 are activated when electric voltage is applied thereto. The actuator 300 has a structure of operating in such a manner that the first and second electro-active polymers 320 and 350 cause the vibration plate 310 vibrate. Accordingly, the actuator 300 can provide various types of haptic feedback by using the first and second electro-active polymers 320 and 350 in comparison with the actuator 300 using one electro-active polymer 320.

Figure 12:
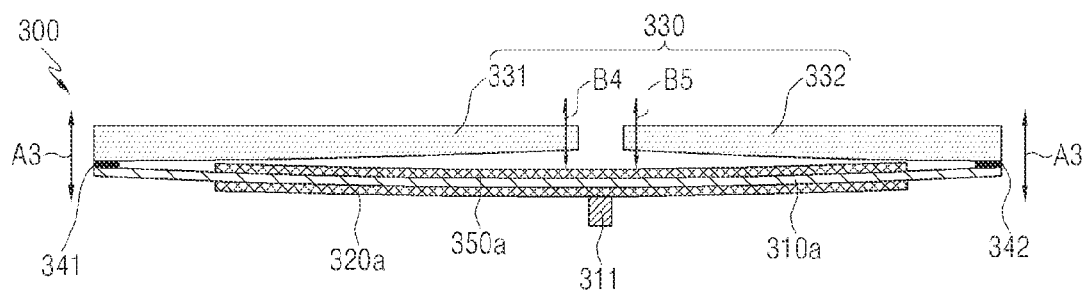
FIG. 12 is a cross-sectional view illustrating a variation example of an actuator using the electro-active polymer shown in FIG. 11, in which the actuator has a curved vibration plate and two electro-active polymers.

FIG. 12 is a view illustrating a variation of an actuator shown in FIG. 11, which includes a curved vibration plate and two electro-active polymers according to the embodiment of the present invention shown in FIG. 11. The actuator 300 of FIG. 12 has a structure similar to the actuator shown in FIG. 11, except for the curved vibration plate 310a. That is, referring to FIG. 12, the actuator 300 of the embodiment of the present invention has the curved vibration plate 310a to be formed concavely around a fixing member 311. The concavely curved vibration plate 310a has the first and second electro-active polymers 320a and 350a respectively attached to each of lower and upper surfaces thereof. First and second masses 332 and 331 are respectively fixed to both ends of the vibration plate 310 which are upward lifted, by means of first and second combination members 342 and 341, and are suspended to be opposite to each other toward the fixing member 311. A distance between the suspended ends of the first and second masses 332 and 331 and the vibration plate 310 shown in FIG. 12 is larger than the distance between the suspended ends of the first and second masses 332 and 331 shown in FIG. 11. As a result, it is possible to provide various types of haptic feedback to a user, and also it is possible to install the actuator in an electronic device which has a curved shape.

According to the embodiments of the present invention shown in FIGS. 1 to 12, in the actuators 100, 200 and 300 using the electro-active polymers, the vibration plates may be fixed to various positions and formed in a curved manner. Accordingly, stable vibrations can be provided, thereby improving a reliability of the actuators. Further, since some of the actuators have the curved vibration plate, it is possible to generate a variety of vibrations so as to provide various types of haptic feedback, and also to provide the actuators to electronic devices with various shapes.

FIGS. 13 to 16 are schematic views illustrating touch panels including the actuators using the electro-active polymers according to the embodiments of the present invention shown in FIGS. 1A to 12.

Figure 13:
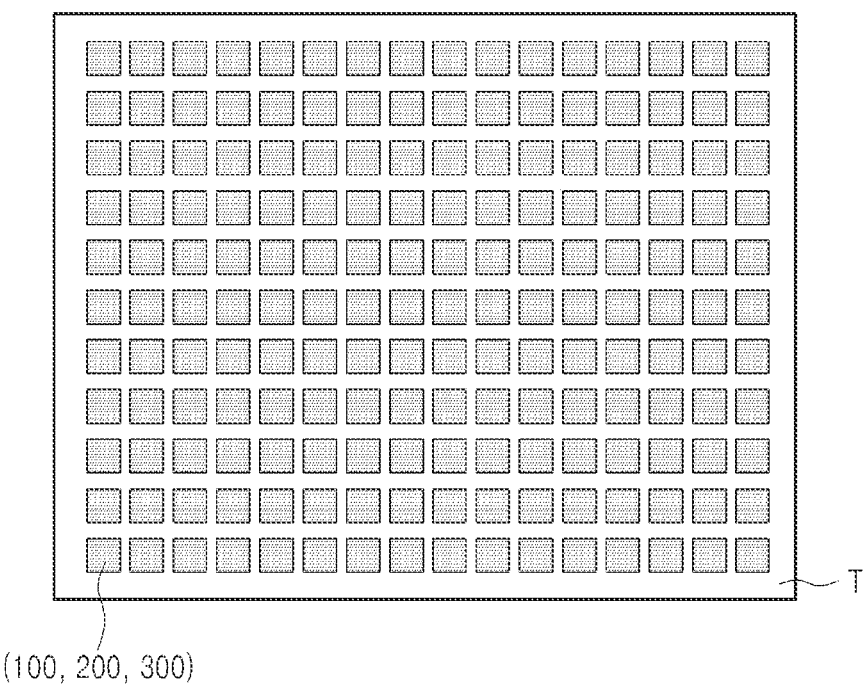
FIG. 13 is a view illustrating a flexible touch panel of an electronic device on which the actuator using an electro-active polymer according to embodiments of the present invention is disposed.
Figure 14:
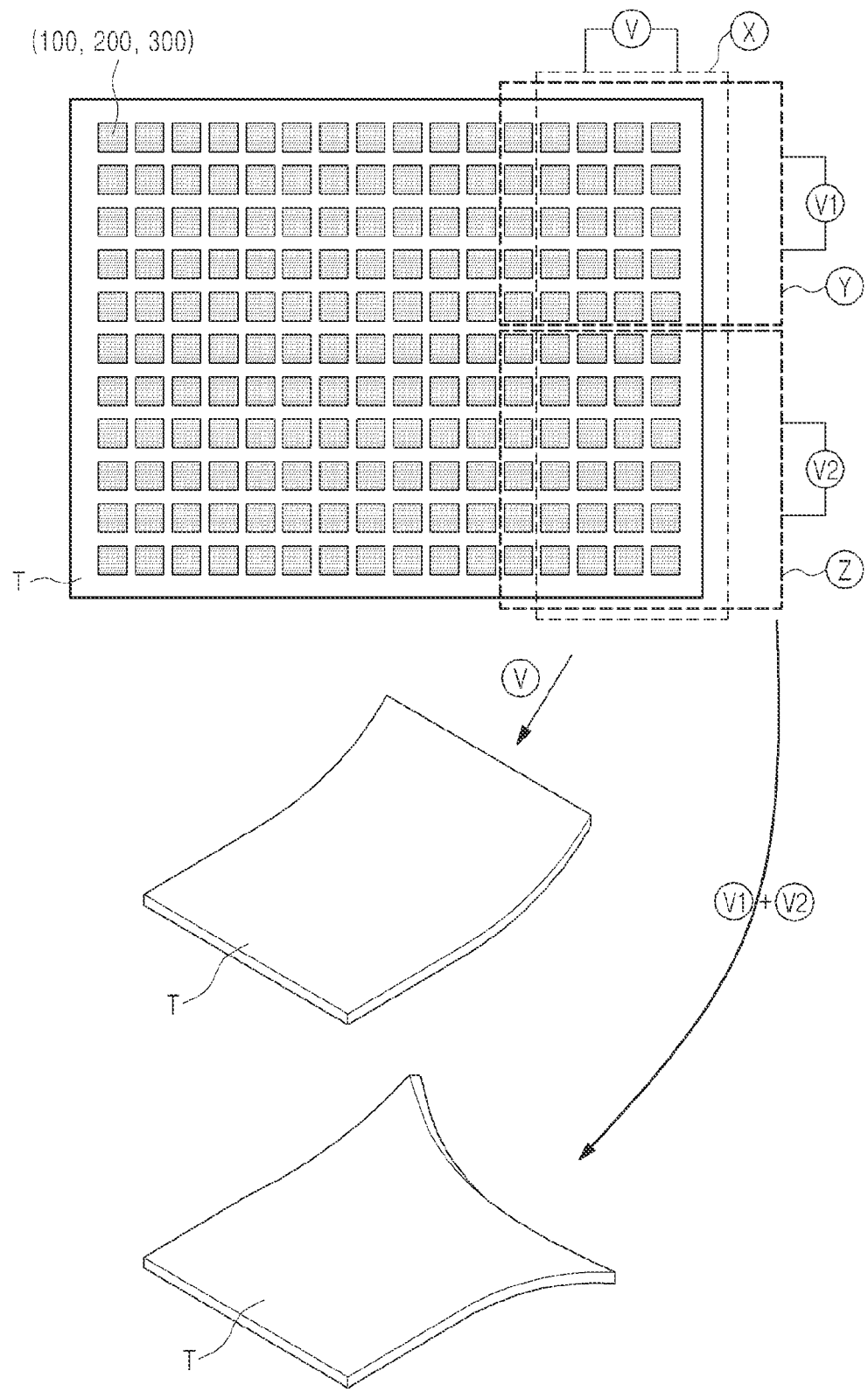
FIG. 14 is a view illustrating the flexible touch panel of FIG. 13, in which the flexible touch panel is deformed when electric voltage is applied to a part of the touch panel.

FIG. 13 is a view illustrating a touch panel of an electronic device which has the actuators using the electro-active polymers according to the embodiments of the present invention, and FIG. 14 is a view illustrating a deformation of the flexible touch panel shown in FIG. 13, when electric voltage is applied to a part of the touch panel.

Referring to FIGS. 13 and 14, a plurality of actuators 100, 200, and/or 300 using the electro-active polymers according to the embodiments as described above is disposed at predetermined locations beneath the touch panel T. In the present invention, the actuators 100, 200, and/or 300 which are disposed in an n×m array beneath the touch panel T will be described as an example. However, the array of the actuators is not limited to the above-mentioned example. It will be understood that the actuators may be arrayed at various positions and in various forms. The actuators 100, 200, and/or 300 disposed under a position where a user touches the touch panel, are activated and vibrated so as to provide haptic feedback to the user.

If the actuators 100, 200, and/or 300 according to the embodiments of the present invention are mounted on the flexible touch panel T, the electro-active polymer(s) of each actuator 100, 200, and/or 300 is/are deformed and stay(s) in a deformed state when electric voltage is applied to and held in some actuators 100, 200, and/or 300 which are disposed on an X-axis, Y-axis, or Z-axis. Therefore, the flexible touch panel T is made to be deformed. As shown in FIG. 14, when the same electric voltage is applied to the actuators 100, 200, and/or 300 which are provided at a side of the touch panel T, from a plurality of actuators 100, 200, and/or 300, so as to hold a rising state of the electro-active polymers, the part of the touch panel T may be bent and held in three dimensions so that the touch panel can provide three dimensional haptic feedback as well as the vibration to the user.

For example, during the application of electric voltage to the actuators 100, 200, and/or 300 which are provide to a side of the touch panel, electric current is applied to the actuators 100, 200, and/or 300 so that some actuators Y and remaining actuators Z are activated in different directions (for example, positive current is applied to some actuators while negative current is applied to remaining actuators). As a result, a part of the touch panel is bent upward and a remainder of the touch panel is bent downward so that three-dimensional haptic feedback can be provided to the user.

Figure 15:
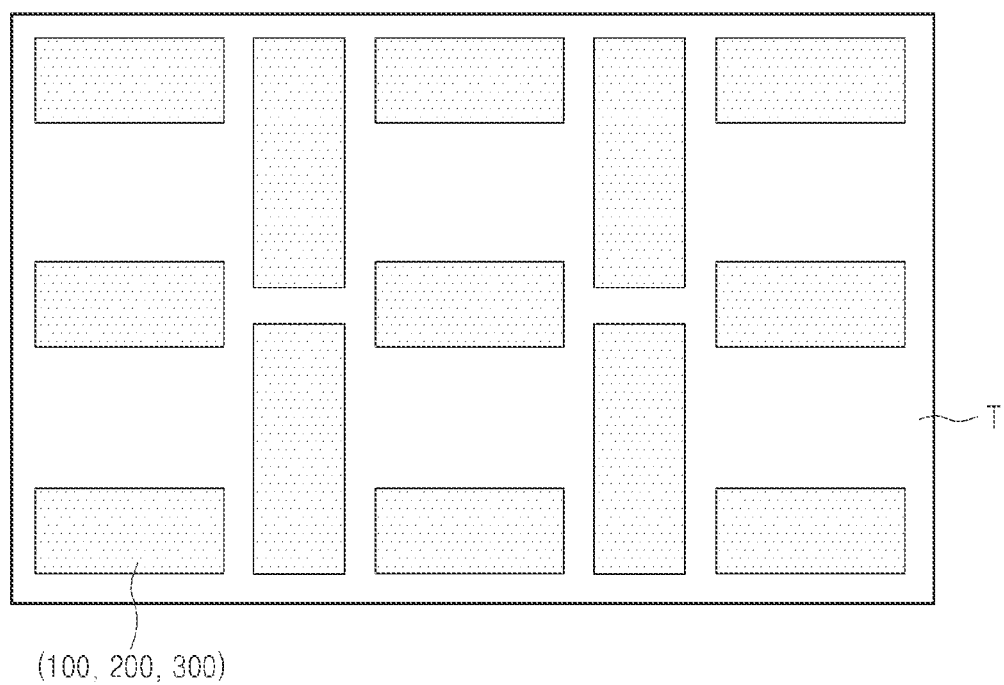
FIG. 15 is a view illustrating the flexible touch panel on which the actuator using the electro-active polymer according to the embodiments of the present invention is disposed.
Figure 16:
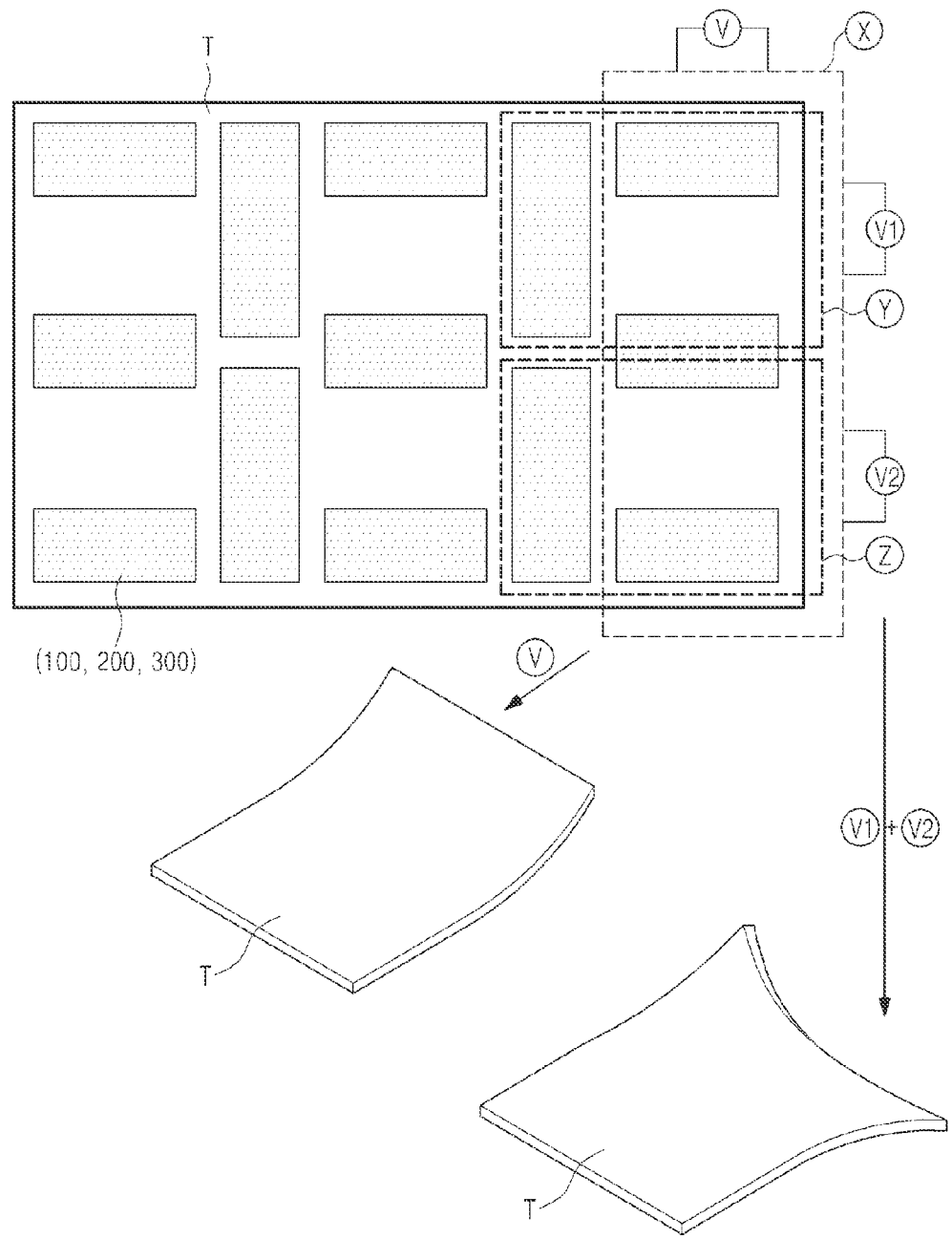
FIG. 16 is a view illustrating the flexible touch panel of FIG. 15, in which the flexible touch panel is deformed when electric voltage is applied to a part of the touch panel.

FIG. 15 is a view illustrating a touch panel of an electronic device which has a different array of actuators including electro-active polymers according to the embodiments of the present invention, and FIG. 16 is a view illustrating a deformation of the flexible touch panel shown in FIG. 15, when electric voltage is applied to a part of the touch panel. FIGS. 15 and 16 show an example of a touch panel T which has a plurality of actuators 100, 200, and/or 300 according to the embodiments of the present invention, and in which an array of the actuators is different from that of FIGS. 13 and 14. As shown in FIGS. 15 and 16, the touch panel has the same structure and operation as those of the touch panel shown in FIGS. 13 and 14, except that the array of the actuators is different from that of the touch panel shown in FIGS. 13 and 14.

Although not shown, the actuators may be arranged on a curved touch panel so as to provide haptic feedback to a user.

According to the present invention, electro-active polymer actuators are provided to a touch panel. The actuators can be easily deformed during the vibration, and the electro-active polymer can be flexibly deformed. Thereby, there is an advantage in that the actuators can be stably driven although an electronic device is damaged due to a fall or deformation.

Further, the electro-active polymers can be provided to a curved vibration plate as well as a flat vibration plate. Accordingly, it is possible to maximize the vibration and also to provide various types of haptic feedback.

Furthermore, a plurality of electro-active polymer actuators can be provided to a flexible touch panel. Electric voltage is applied to and held in some of the plurality of actuators which are provided to the touch panel, thereby deforming the touch panel in various forms.

Particularly, when the identical voltage is applied to the actuators, the actuators are deformed in the same direction. When the different electric voltages are respectively applied to some of the actuators and remaining actuators, the touch panel can be deformed in different directions, thereby providing the user with various types of haptic feedback.

While the present invention has been shown and described with reference to certain embodiments thereof, it will be understood by those skilled in the art that various changes in form and details may be made therein without departing from the spirit and scope of the present invention as defined by the appended claims.

What is claimed is:

1. An electronic device having actuators including electro-active polymers, the electronic device comprising:
    a flexible touch panel; and
    a plurality of actuators arranged beneath a lower surface of the touch panel, each of the plurality of actuators having one or more electro-active polymers,
    wherein the actuators comprise:
        a vibration plate fixed to the electronic device by means of at least one fixing member;
        at least one electro-active polymer attached to the vibration plate and activated when electric voltage is applied to the at least one electro-active polymer; and
        at least one mass joined to an upper surface of the vibration plate so that at least one end of the at least one mass is suspended with respect to a combination member, and increasing a vibration force of the vibration plate as the electro-active polymer is activated; and
        a combination member for joining at least one end of the mass to the upper surface of the vibration plate.

2. The electronic device as claimed in claim 1, wherein, when the electric voltage is applied to and held in some of the plurality of actuators, the electro-active polymers to which the electric voltage is applied are maintained in a deformed state according to the electric voltage, so as to three-dimensionally deform the touch panel.

* * * * *